(12) United States Patent
Schmid et al.

(10) Patent No.: US 7,602,069 B2
(45) Date of Patent: Oct. 13, 2009

(54) MICRO ELECTRONIC COMPONENT WITH ELECTRICALLY ACCESSIBLE METALLIC CLUSTERS

(75) Inventors: Günter Schmid, Velbert (DE); Ulrich Simon, Aachen (DE); Dieter Jäger, Duisburg-Rahm (DE); Venugopal Santhanam, Bangalore (IN); Torsten Reuter, Essen (DE)

(73) Assignee: Universität Duisburg-Essen, Essen (DE)

( * ) Notice: Subject to any disclaimer, the term of this patent is extended or adjusted under 35 U.S.C. 154(b) by 306 days.

(21) Appl. No.: 11/492,473

(22) Filed: Jul. 25, 2006

(65) Prior Publication Data

US 2006/0267214 A1    Nov. 30, 2006

Related U.S. Application Data

(63) Continuation-in-part of application No. 11/093,196, filed on Mar. 29, 2005, now abandoned.

(30) Foreign Application Priority Data

| Mar. 31, 2004 | (DE) | ................. 10 2004 016 534 |
| Apr. 15, 2004 | (DE) | ................. 10 2004 018 915 |
| Jul. 22, 2004 | (DE) | ................. 10 2004 035 615 |
| Jul. 26, 2005 | (EP) | ......................... 05016200 |

(51) Int. Cl.
*H01L 23/535* (2006.01)

(52) U.S. Cl. .................. 257/776; 257/9; 257/319; 257/E29.322; 257/E49.003; 977/774; 977/810; 977/940; 977/943

(58) Field of Classification Search ............. 257/315, 257/E29.322, E39.013, E49.003, 9, 319, 257/776; 977/773, 774, 810, 932, 940, 943
See application file for complete search history.

(56) References Cited

U.S. PATENT DOCUMENTS

| 3,203,319 | A |   | 8/1965  | Cook .............................. 91/45 |
| 5,350,930 | A |   | 9/1994  | Schmid et al. ................. 257/14 |
| 5,844,834 | A |   | 12/1998 | Risch et al. ................... 365/150 |
| 5,997,958 | A | * | 12/1999 | Sato et al. ..................... 427/468 |
| 6,103,600 | A | * | 8/2000  | Ueda et al. ................... 438/503 |

(Continued)

FOREIGN PATENT DOCUMENTS

DE         2 039 955     2/1971

(Continued)

OTHER PUBLICATIONS

Nano Letters 2003, vol. 3, No. 3, 305-307 "Reduced Metallic Properties of Ligand-Stabilized Small Metal Clusters", Zhang et al., Feb. 8, 2003.

(Continued)

*Primary Examiner*—Anh Phung
*Assistant Examiner*—Michael Lulis
(74) *Attorney, Agent, or Firm*—Woodard, Emhardt, Moriarty, McNett & Henry LLP

(57) ABSTRACT

A micro electronic component, preferably in the form of an electronic memory, includes the use of clusters as an electronic memory. Also disclosed as part of the present invention is a method for fabricating a micro electronic component. The present invention contemplates fabrication of an especially compact electronic memory that works especially with single-electron transistors or single-electronic transfers. According to the present invention, clusters with a metallic cluster nucleus are arranged in parallel grooves essentially in lines or rows and are connected individually to first and second connecting electrodes, such that individually the clusters can be electrically modified or polled independently of each other.

27 Claims, 5 Drawing Sheets

U.S. PATENT DOCUMENTS

| | | | |
|---|---|---|---|
| 6,314,019 B1 | 11/2001 | Kuekes et al. | 365/151 |
| 7,256,435 B1 * | 8/2007 | Kornilovich et al. | 257/208 |
| 2002/0003307 A1 | 1/2002 | Suga | 257/777 |
| 2002/0123227 A1 | 9/2002 | Winningham | 438/700 |
| 2002/0146742 A1 | 10/2002 | Wybourne et al. | 435/7.1 |
| 2004/0026682 A1 | 2/2004 | Jiang | 257/4 |
| 2004/0166673 A1 | 8/2004 | Hutchison et al. | 438/686 |
| 2005/0214661 A1 | 9/2005 | Stasiak et al. | |

FOREIGN PATENT DOCUMENTS

| | | |
|---|---|---|
| DE | 42 12 220 A1 | 10/1993 |
| DE | 42 42 367 A1 | 6/1994 |
| DE | 196 09 301 C2 | 9/1997 |
| DE | 100 30 015 A1 | 1/2002 |
| DE | 101 32 024 A1 | 1/2002 |
| EP | 0 836 232 A1 | 4/1998 |
| WO | WO 00/41247 | 7/2000 |
| WO | WO 0041245 | 7/2000 |
| WO | WO 03/084863 A1 | 10/2003 |
| WO | WO 2004/032147 A1 | 4/2004 |

OTHER PUBLICATIONS

Advanced Materials 10, No. 7, "Metal Clusters and Colloids", Schmid et al., 1998.

Applied Physics A 66, S187-S190, "Single-electron tunneling in $Au_{55}$ cluster monolayers", Chi et al., 1998.

Japan Journal of Applied Physics, vol. 38, (1999) pp. L473-L-476. "Control of Interdot Space and Dot Size in a Two-Dimensional Gold Nanodot Array", Huang et al.

American Institute of Physics, vol. 81, No. 24, pp. 4595-4597, "Single-electron transistors and memory cells with Au colloidal islands", Wu et al.

* cited by examiner

MICRO ELECTRONIC COMPONENT WITH ELECTRICALLY ACCESSIBLE METALLIC CLUSTERS

CROSS-REFERENCES TO RELATED APPLICATIONS

The present application is a Continuation-In-Part of U.S. patent application Ser. No. 11/093,196, filed Mar. 29, 2005, entitled "MICRO ELECTRONIC COMPONENT" which is hereby incorporated by reference in its entirety.

The present application claims the benefit of German Patent Application Serial No. 10 2004 016 534.3, filed Mar. 31, 2004; German Patent Application Serial No. 10 2004 018 915.3, filed Apr. 15, 2004; and German Patent Application Serial No. 10 2004 035 615.7, filed Jul. 22, 2004, and European Patent Application Serial No. 05016200, filed Jul. 26, 2005, all of which are hereby incorporated by reference in their entirety.

BACKGROUND OF THE INVENTION

The present invention relates to a microelectronic component, especially a memory, a use of clusters, and a method for fabricating a microelectronic component.

From U.S. Pat. No. 5,350,930 A, a microelectronic component with at least one cluster is known. Here, micro-quantum channels are formed by at least two, preferably many adjoining clusters. The quantum channels can extend between connecting electrodes. Preferably, bulk material of the clusters is used and this bulk material is pressed together. The clusters each have a metallic cluster nucleus and an insulating ligand shell. The cluster nuclei each have, in particular, 55 gold atoms in close-packed sphere packing. The known component achieves further miniaturization in the field of microelectronics. In comparison with typical space requirements of approximately 250 nm for transistors in previously known technology, the dimensions for the quantum wires of the known components can be reduced significantly.

In addition, intensive research has been performed in the field of metal clusters especially with 55 gold atoms. As examples of this research, the following articles are mentioned: "Single-electron tunneling in $Au_{55}$ cluster monolayers" by L. F. Chi et al., Appl. Phys. A 66, pp. 187-190 (1998); "Metal Clusters and Colloids," Günter Schmid et al., Adv. Mater. 1998, 10, No. 7; "Reduced Metallic Properties of Ligand-Stabilized Small Metal Clusters," Huijing Zhang et al., NANO LETTERS 2003, Vol. 3, No. 3, 305-307.

The present invention is based on the problem of disclosing a microelectronic component, a use of clusters with metallic cluster nuclei, and a method for fabricating a microelectronic component, wherein a microelectronic component can be realized, especially in the form of an electronic memory or with single-electron transistors, which has minimal space requirements, as well as minimal power and energy requirements, and which can be fabricated easily, and which operates, in particular, at room temperature.

An essential idea of the present invention is to electrically connect clusters individually such that these can be electrically modified independently of each other and individually, especially through single-electron transfer, and/or their electrical state can be polled.

The individual, electrical modification and polling permits addressing, so that an electronic memory can be realized with a plurality of "memory cells" or transistors formed by the connected clusters.

Therefore, because only a single cluster is necessary for each memory cell or transistor, the space requirement is minimized.

The ideally provided single-electron transfer for changing the electrical or electronic state of a connected cluster minimizes the necessary power and energy requirements, so that very quick switching times can be realized and the low loss heat in contrast with conventional solutions enables miniaturization without cooling problems and especially use at room temperature or higher temperatures.

In the preferred embodiments described in more detail below, not all of the clusters are connected electrically; instead only a few of the clusters are in contact with first and second connecting electrodes. Here, the non-connected clusters are not disturbed.

Furthermore, there can also be defective connections in so far as two connecting electrodes contact two parallel, adjacent clusters instead of an in-between cluster at an intersecting point. However, the likelihood of such a defect is sufficiently small or even negligible for a width of the connecting electrodes that preferably corresponds essentially to the average cluster diameter.

Preferably, the clusters are arranged essentially in lines or rows. According to a preferred embodiment, this is enabled very easily by housing the clusters in parallel grooves of equal size.

A very simple design and very simple bonding is preferably achieved by forming the first and second connecting electrodes in strips and arranging them such that the first connecting electrodes run parallel to each other and the second connecting electrodes run parallel to each other and crosswise to the first connecting electrodes, with a first and a second connecting electrode being in electrical contact with each other at their appropriate intersecting point preferably by means of a single cluster.

Additional advantages, features, properties, and aspects of the present invention emerge from the claims and the subsequent description of preferred embodiments with reference to the drawing.

BRIEF SUMMARY OF THE INVENTION

In the preferred embodiments described in more detail below, not all of the clusters are connected electrically; instead only a few of the clusters are in contact with first and second connecting electrodes. Here, the non-connected clusters are not disturbed.

Furthermore, there can also be defective connections in so far as two connecting electrodes contact two parallel, adjacent clusters instead of an in-between cluster at an intersecting point. However, the likelihood of such a defect is sufficiently small and ideally negligible for a correspondingly small width of the connecting electrodes.

Preferably, the clusters are arranged essentially in lines or rows. According to a preferred embodiment, this is enabled very easily by housing the clusters in parallel grooves of equal size.

A very simple design and very simple bonding is preferably achieved by forming the first and second connecting electrodes in strips and arranging them such that the first connecting electrodes run parallel to each other and the second connecting electrodes run parallel to each other and crosswise to the first connecting electrodes, with a first and a second connecting electrode being in electrical contact with each other at their appropriate intersecting point preferably by means of a single cluster.

Additional advantages, features, properties, and aspects of the present invention emerge from the claims and the subsequent description of a preferred embodiment with reference to the drawings.

DETAILED DESCRIPTION OF THE INVENTION

Figure 1:
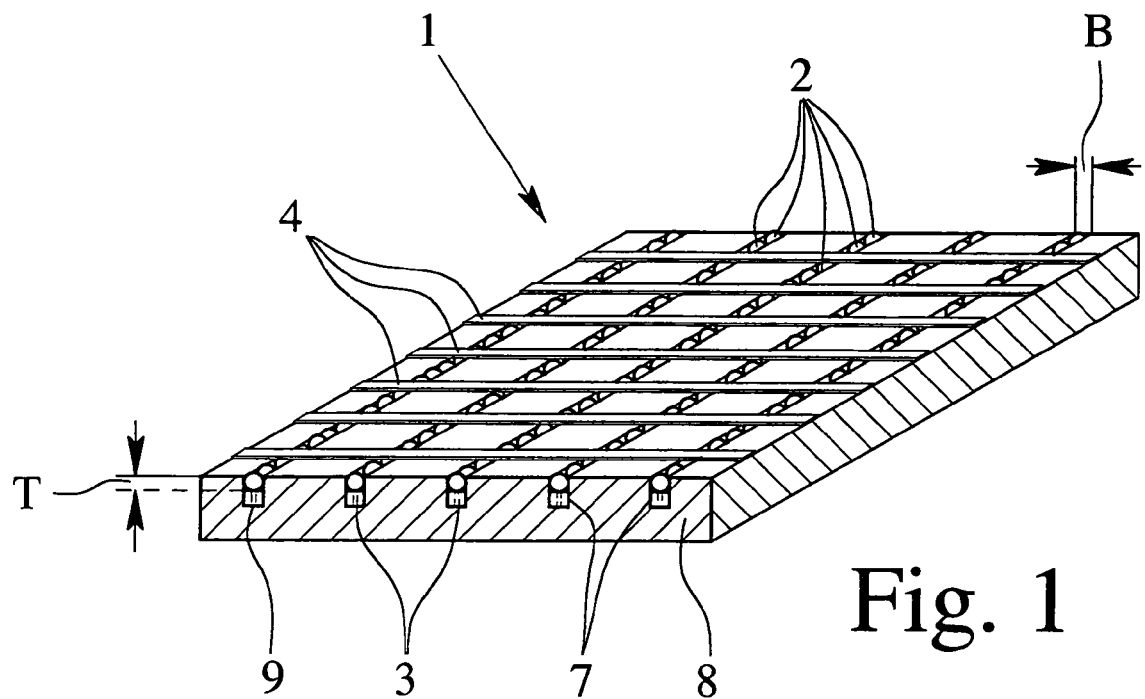
FIG. 1 is a schematic, perspective illustration of a microelectronic component according to the proposal with a plurality of clusters according to a first embodiment.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

In the figures, the same reference symbols are used for equivalent or similar parts, wherein corresponding or comparable properties and advantages are achieved even if a description is not repeated, especially due to reasons of simplification.

FIG. 1 shows in a schematic, perspective illustration a microelectronic component 1 according to a first embodiment. In particular, this embodiment concerns an electronic memory with a plurality of memory cells or transistors, preferably single-electron transistors. However, the microelectronic component 1 can also be used for other purposes.

The microelectronic component 1 has a plurality of clusters 2, which are shown in FIG. 1 in the shape of balls.

The microelectronic component 1 further has first and second connecting electrodes 3, 4 for electrical attachment or contact to clusters 2. This will be discussed in more detail below.

Figure 2:
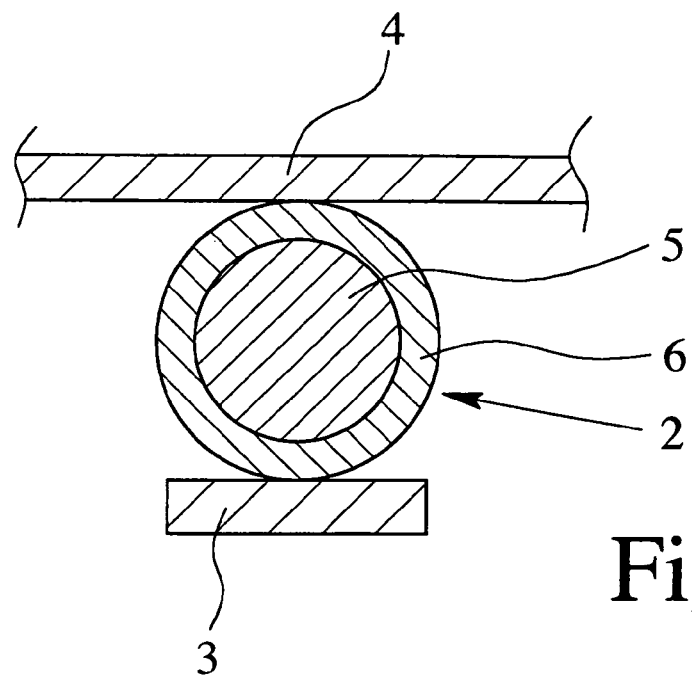
FIG. 2 is a schematic, sectional illustration of a cluster with allocated connecting electrodes of the microelectronic component according to the first embodiment.

FIG. 2 shows in a schematic, sectional illustration the preferred design of a cluster 2. The cluster 2 has a metallic cluster nucleus 5 and a preferably electrically insulating cluster shell 6.

The cluster nucleus 5 is preferably composed of a transition metal, especially gold. Each cluster nucleus 5 comprises several metal atoms, especially at least 20 and/or a maximum of 100 metal atoms, particularly preferred 55 metal atoms, which are arranged especially in close-packed sphere packing in multiple shells.

However, the cluster nuclei 5 can also be built from a different number of atoms, especially when each cluster nucleus 5 is composed of several transition metals.

The maximum size of the cluster nuclei 5 preferably equals approximately 2.5 nm, especially approximately 2.0 nm, and particularly preferred 1.6 nm; and its minimum size is at least approximately 0.5 nm, especially approximately 1.0 nm, and particularly preferred approximately 1.3 nm. It is particularly preferred when the average size of the cluster nuclei 5 lies in the range from approximately 1.3 nm to approximately 1.5 nm.

The cluster shell 6 is preferably formed so that it is electrically insulating and is composed of organic compounds. However, the cluster shell 6 can also be formed, for example, from inorganic compounds and/or another metal.

Preferably, the cluster shell 6 is composed of suitable ligands, for example, organic radicals or halogens, especially chlorine. Examples of suitable organic compounds are triphenylphosphine and its derivatives.

The clusters 2—thus cluster nucleus 5 and cluster shell 6—preferably have an average diameter of 1-5 nm, especially 2-3 nm, particularly preferred of essentially 2.5 nm.

Especially preferred are clusters 2 with the following formula:

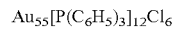

$$Au_{55}[P(C_6H_5)_3]_{12}Cl_6$$

The fabrication of the clusters 2 can be easily found in the literature. In particular, one reference is the article mentioned in the introduction and the locations cited therein. Incidentally, the clusters 2 can also be easily purchased in modified form (with different cluster shells 6), for example, under the trade name of Nanogold from Nanoprobe [sic; Nanoprobes, Inc.], USA.

FIG. 2 further shows that the illustrated cluster 2 is connected both to a first connecting electrode 3 and also to a second connecting electrode 4. This represents the ideal or desired configuration and in particular forms a "memory cell" or an individual electronic functional unit of a plurality of equivalent functional units of the microelectronic component 1.

The electronic properties of the cluster nucleus 5 or the cluster 2 do not correspond to those of a metal, but instead more to those of a semiconductor. Thus, a sort of "conductor-semiconductor-conductor" contact is obtained. The cluster 2 forms a tunnel contact with the connecting electrodes 3, 4. Accordingly, electrons can flow between the connecting electrodes 3, 4 and the cluster 2. In particular, single-electron transfers are sufficient to change the electrical state of the cluster 2. Accordingly, a kind of "single-electron transistor"—thus a memory cell or circuit preferably switching with only a single electron—can be formed with the mentioned configuration.

As shown in FIG. 2, in principle the clusters 2 are connected individually to a first and second connecting electrode 3, 4. In particular, a first and a second connecting electrode 3, 4 are basically in electrical contact with each other only by means of at most one cluster 2. Thus, an optimum miniaturization and simpler design, as well as low power and energy requirements, are enabled.

If necessary, not-shown control electrodes, like those typical in transistors, can also be allocated to the connected clusters 2.

The clusters 2 are preferably arranged in lines or rows, especially only in one plane, as shown in FIG. 1. In particular, the clusters 2 are housed in grooves 7 arranged and configured corresponding to this arrangement in a carrier 8 of the microelectronic component 1.

In the embodiment, the grooves 7 essentially have a rectangular cross section and optionally have a curved groove base 9. In particular, this also depends on the fabrication process, which will be discussed in more detail below.

The width B of the grooves 7 is as small as possible, so that the clusters 2 fit as much as possible in only one row and not one next to the other in the grooves 7. Preferably, the maximum width B of the grooves 7 is 5 nm, particularly 4 nm, and advantageously approximately 3 nm.

Preferably, the diameter of the clusters 2 equals at least 50%, particularly at least 70%, of the width B of the grooves 7. In the ideal case, this leads to an at least essentially straight-line chain of clusters 2 in the grooves 7.

In the embodiment, the first connecting electrodes 3 are arranged in the grooves 7, in particular formed directly on the groove bases 9. The maximum remaining clear depth T of the grooves 7 equals preferably 3 nm, particularly 2 nm. In particular, the clear depth T is smaller than the average diameter of the clusters 2. In this way, the clusters 2 housed in the grooves 7 project somewhat out of the grooves 7 in order to simplify the electrical contact to the second connecting electrodes 4 preferably running crosswise to the longitudinal direction of the grooves 7.

In the embodiment, the first connecting electrodes 3 run parallel to each other and in a common plane.

In the embodiment, the second connecting electrodes 4 likewise run parallel to each other in a common plane and crosswise, especially perpendicular, to the first connecting electrodes 3 or the cluster rows or grooves 7.

To achieve the individual bonding of the clusters 2 already explained with reference to FIG. 2, the spacing of the planes of the first and second connecting electrodes 3, 4 corresponds approximately to the average diameter of the clusters 2.

The distance between the grooves 7 or cluster rows 2 is preferably as small as possible. In particular, it equals 3-100 nm, preferably approximately 5-60 nm. A corresponding situation applies to the distance between the second connecting electrodes 4.

The second connecting electrodes 4 are each formed essentially like connecting elements or strips. The width B is as small as possible and preferably equals a maximum of 4 nm. It particularly equals essentially 2.5 or 3 nm or, in particular, essentially approximately 50-125% of the average diameter of the clusters 2. Thus, the second connecting electrodes 4 can each contact as much as possible only a single cluster 2 of one groove 7. If two clusters 2 in one groove 7 are contacted simultaneously by a second connecting electrode 4, then this is a defect point or defective memory cell.

The mentioned width B for the second connecting electrodes 4 also applies preferably for the first connecting electrodes 3, especially when the clusters 2 are arranged on freely accessible first connecting electrodes 3, that is, not in the grooves 7, as explained farther below for a second embodiment of the present invention.

As already explained in the introduction, for the shown embodiment, not all of the clusters 2 are contacted, instead only those in the region of the intersecting points between the first and second connecting electrodes 3, 4. The other, non-contacted clusters 2 are then non-critical components for the function of the microelectronic component 1, especially if there are several non-connected clusters 2 in the groove 7 between two adjacent, connected clusters 2 in a groove 7.

Naturally, as an alternative or addition, it is also possible for no other clusters 2 to be arranged between the connected clusters 2 in a groove 7 or for the chain of clusters 2 to be broken, for example, by subsequent elimination or modification of non-contacted clusters 2 or by corresponding, preferably individual positioning of clusters 2 in suitable, not-shown grooves and recesses, which can be generated, for example, through anodic oxidation of aluminum.

In FIG. 1, only the essential structures of the microelectronic component 1 according to the especially preferred embodiment are shown in order to understand the principle of the proposed design. Obviously, instead of this configuration, other structural solutions and arrangements are possible.

The essential feature is that a plurality of clusters 2 are connected individually to a first and second connecting electrode 3, 4, such that these clusters 2 can be electrically modified or polled independently of each other. In particular, the solution according to the proposal also enables simple addressing of the connected clusters 2 or fabricated memory cells.

To modify the electronic behavior or control, not-shown control electrodes or the like can also be allocated to the connected clusters 2.

The fabrication of the microelectronic component 1 according to the first embodiment is described below in more detail. For this purpose, first the fabrication of a tool 10 is described with reference to FIG. 3.

The fabrication of the tool 10 takes advantage of the ability to generate layers of defined thickness, for example through MBE (Molecular Beam Epitaxy), other epitaxy processes, or other suitable methods, and to use these layers of defined thickness for the fabrication of necessary strip structures.

Figure 3:
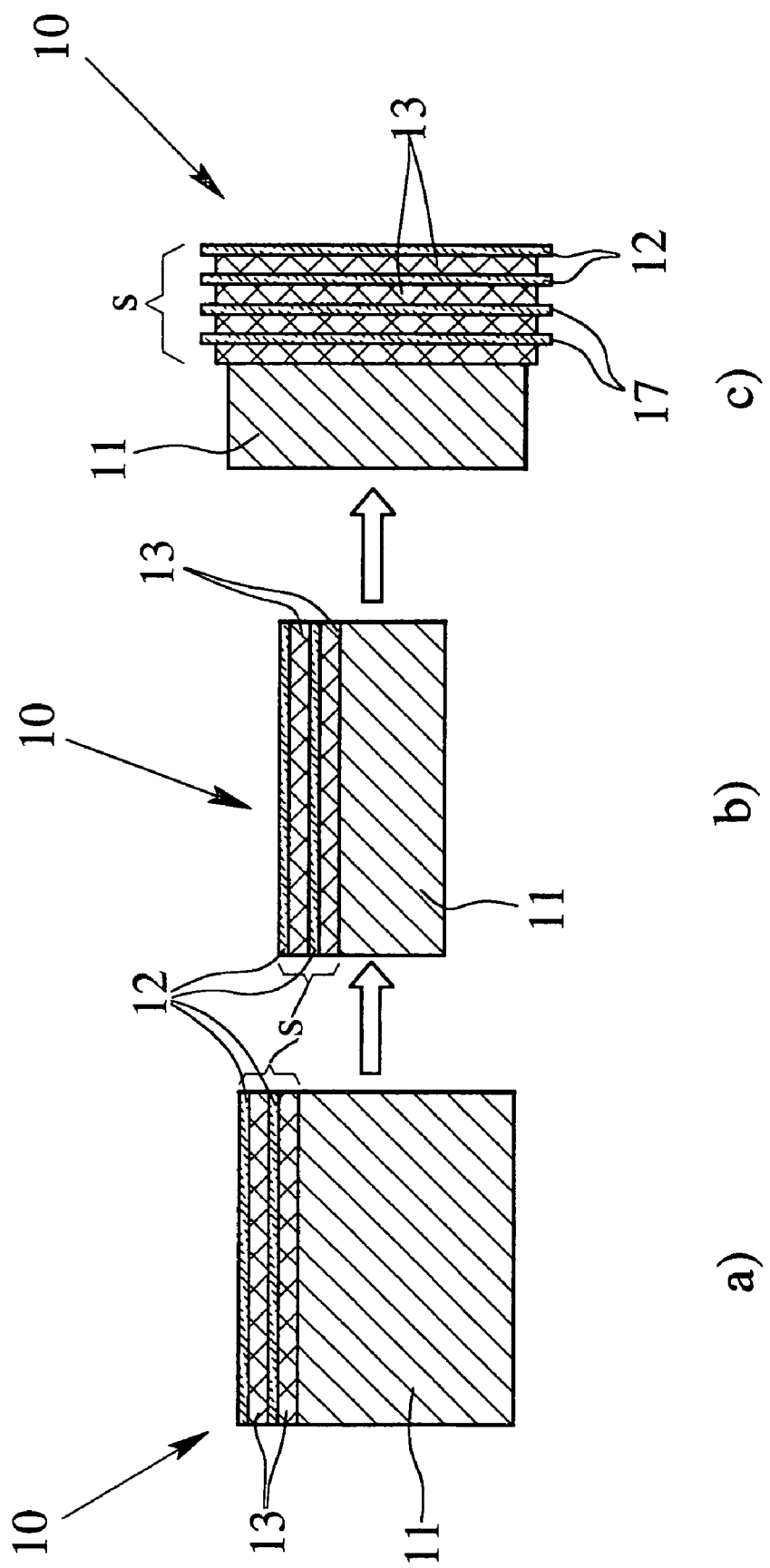
FIG. 3 is a schematic illustration of the fabrication process of a tool for fabricating the microelectronic component according to the first embodiment.

As indicated in FIG. 3, in step a) alternating layers 12, 13 made from different materials, especially GaAs and AlAs, are formed on a substrate 11, for example Si doped with GaAs. In particular, the thin layers 12 composed of AlAs in the embodiment have a thickness of preferably only approximately 2-3 nm, in particular, essentially 2.5 nm. The thickness of the thicker layers 13, which here are composed of GaAs, equals approximately 5 to 100 nm. For example, 20 or up to more than 1000 such layer pairs are deposited one after the other, especially through MBE. In this way, a layer structure S is formed.

Then in step b) at least one side surface is lapped and then selective material is removed, especially through etching (in the embodiment, preferably a solution of citric acid and hydrogen peroxide is used) in order to etch the thicker layers 13 on the sides or in thickness such that the thinner layers 12—in the embodiment the layers 12 made from AlAs—project outwards, especially by approximately 10 to 40 nm.

If necessary, the layer structure S or the thinner or thicker layer 12, 13 can be oxidized, in particular, AlAs to $Al_2O_3$ and/or GaAs to $Ga_2O_3$. This can be beneficial to the desired strength of the tool 10 or the layer structure S.

As an example step c) shows the resulting tool 10 with the thinner layers 12 projecting laterally like connecting elements. The tool 10 then can be used especially as a stamp or die or the like.

Figure 4:
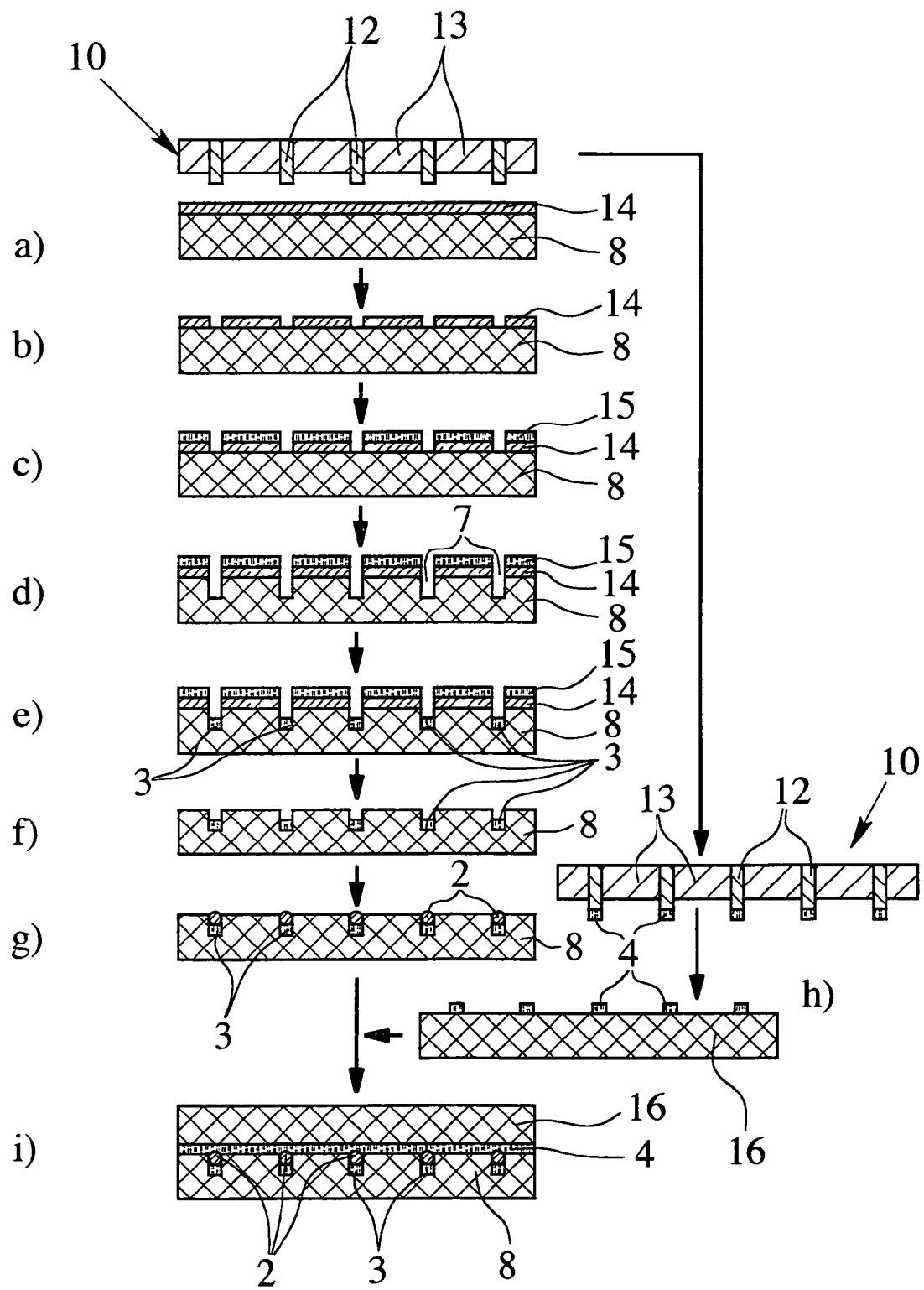
FIG. 4 is a schematic illustration of the fabrication process of the microelectronic component according to the first embodiment.

A preferred method for fabricating the microelectronic component 1 is explained below with reference to FIG. 4.

The carrier 8 is preferably composed of silicon or silicon dioxide. In particular, the carrier is a conventional wafer.

In step a) the carrier 8 is provided with a suitable coating 14, especially made from a polymer, preferably the polymer available under the trade name "mr-8010" from www.microresist.de, with a thickness of approximately 20-150 nm. Then, at an increased temperature of, for example, approximately 180° C., the tool 10 with the projecting edges of the layers 12 is pressed into the coating 14, for example with a force of 20-40 Cn, for example, for 1-5 min. Here, correct alignment of the tool 10 relative to the surface of the carrier 8 is essential.

After separating the tool 10 from the carrier 8, slots or grooves are produced in the coating 14 at desired distances and with the desired width, as indicated in step b).

Then, in step c) the coating 14 is provided with a cover layer 15, preferably made from gold, especially through oblique vapor deposition, in order to not coat the grooves 7.

The cover layer 15 is used as an etching mask in the subsequent etching step d). In particular, dry etching is performed. Thus, the grooves 7 are formed in the carrier 8.

Then, in step e) the first connecting electrodes 3 are formed in the grooves 7. This can be realized, for example, through vapor deposition with a suitable material, such as gold or palladium, or in other suitable ways.

In step f) the layers 14 and 15 are then removed, for example, through ultrasound and/or a suitable solvent, such as acetone.

In step g) the clusters 2 are then arranged in the grooves 7 on the first connecting electrodes 3. This is realized preferably through electrophoresis. For example, the clusters 2 are formed directly by applying a corresponding voltage on the first connecting electrodes 3. Here, it is insignificant that the clusters 2 are in direct contact with each other. Instead, in this way the desired electrical bonding of the clusters 2 with the first connecting electrodes 3 is achieved with very simple means and methods. Furthermore, selective adsorption of the clusters 2 on the first connecting electrodes 3 can be realized, especially by providing the first connecting electrodes 3 with a dithiol monolayer or the like.

In step h) the second connecting electrodes 4 are fabricated. In particular, for this purpose the tool 10 or some other tool is used. In the embodiment, the edges of the projecting, thinner layers 12 are coated with an electrically conductive material, especially gold, palladium, platinum, or the like, preferably through oblique vapor deposition or the like. In this way, the preferably strip-shaped second connecting electrodes 4 are generated.

Preferably, the first connecting electrodes 3 one on hand and the second connecting electrodes 4 on the other hand are composed of electrically different materials or materials, especially metals and/or semiconductor materials, of different electronegativity in order to achieve an asymmetrical design in terms of electricity. However, the connecting electrodes 3 can also be composed of the same material, especially a noble metal, a transition metal, or an alloy related to these metals.

The second connecting electrodes 4 are then transferred onto an electrode carrier 16, which is composed especially of a suitable plastic, such as polydimethylsiloxane or the like, by pressing the tool 10 onto the electrode carrier 16. Preferably, the electrode carrier 16 has at least some elasticity and/or ability to deform plastically. In step h) the electrode carrier 16 is shown with the already transferred second connecting electrodes 4.

Finally, in step i) the electrode carrier 16 is pressed together with the second connecting electrodes 4 onto the carrier 8 with the clusters 2 preferably projecting somewhat out of the grooves 7 and is connected with this in a suitable way. The second connecting electrodes 4 running parallel to each other extend crosswise, especially perpendicular, to the cluster rows or grooves 7 and thus also to the first connecting electrodes 3. In this way, the microelectronic component 1 according to the proposal is then completed.

A second embodiment of the proposed microelectronic component 1 and the proposed method for fabricating the microelectronic component 1 is explained below with reference to FIGS. 5 and 6. Below, primarily only essential differences relative to the first embodiment are emphasized, so that the previous explanations and statements are to be considered as supplemental or appropriate.

In the second embodiment, there are no grooves 7 for housing the clusters 2 and/or the first connecting electrodes 3. Instead, the first connecting electrodes 3 are freely accessible in the fabrication for the clusters 2.

The first connecting electrodes 3 preferably have, in turn, a strip-like form and are arranged parallel to each other, especially in a common plane. In turn, the width B of the first connecting electrodes 3 is preferably very small, as already explained for the first embodiment.

Preferably, the first connecting electrodes 3 are formed on preferably protruding end sides (narrow sides) 17 of a layer structure S, as indicated in FIG. 3c), particularly through vapor deposition with gold. The preferred fabrication is explained 20 in detail farther below with reference to FIG. 6. However, the first connecting electrodes 3 can also be fabricated in any other suitable way.

Figure 5:
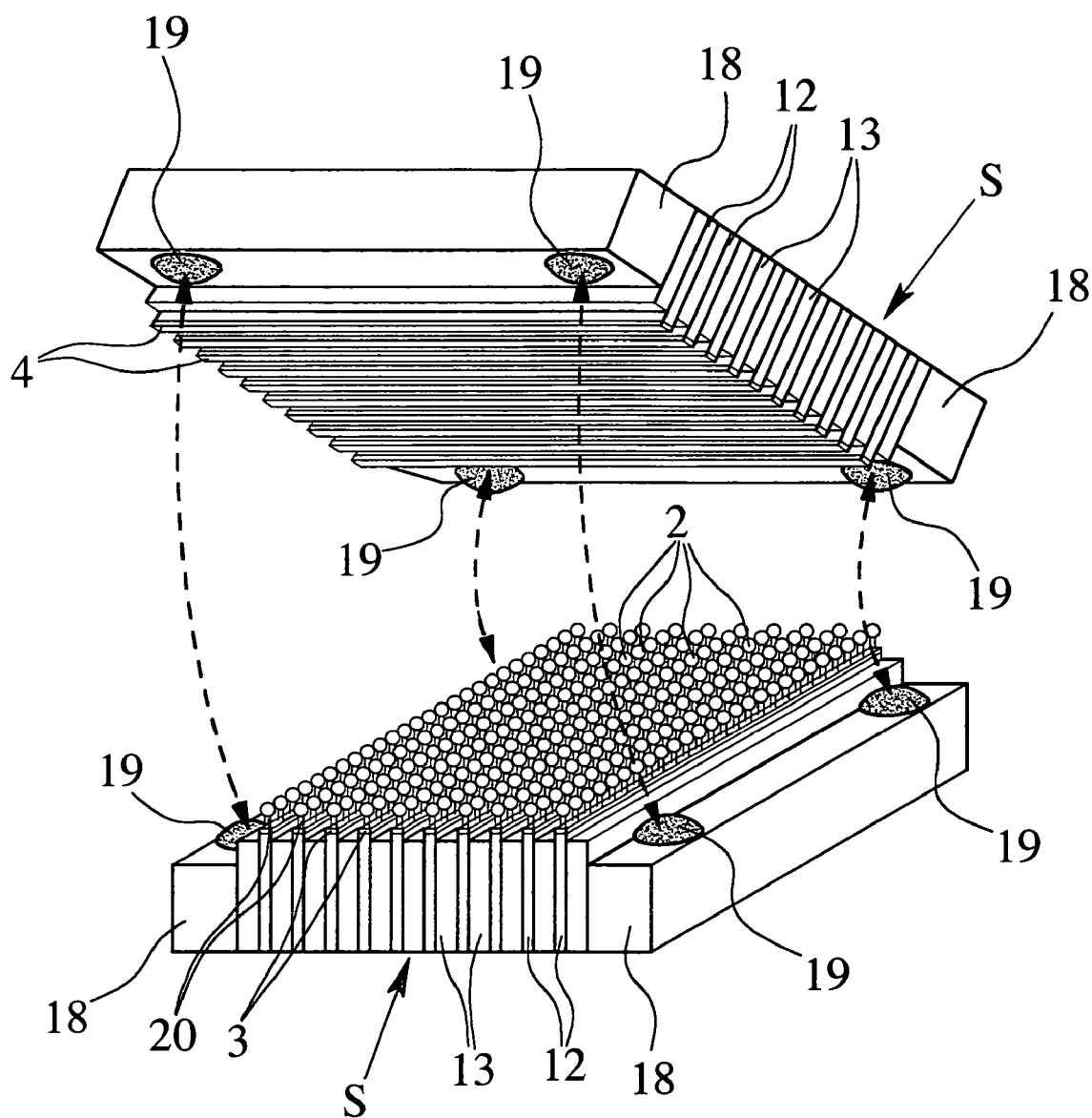
FIG. 5 is a schematic, exploded-view illustration of a proposed microelectronic component according to a second embodiment.

The clusters 2 are preferably in a continuous arrangement—in particular, in a line one directly behind the other without spacing in the longitudinal extent—on the first connecting electrodes 3, as shown in FIG. 5. In the second embodiment, the clusters 2 can be arranged—as in the first embodiment—through electrophoresis or through selective adsorption on the first connecting electrodes 3.

In an especially preferred way, the clusters 2 are arranged on the first connecting electrodes 3 or the clusters 2 are connected to the first connecting electrodes 3 through chemical bonds, especially covalent bonds and/or thiol bonds between the clusters 2 or cluster nuclei 5 on one hand and the first connecting electrodes 3 on the other hand. In particular, for this purpose the first connecting electrodes 3 preferably composed of gold are chemically modified—for example, with phenylenedithiol, so that covalent gold-sulfur bonds can be formed between the connecting electrodes 3 and the thiols and/or between the thiols and the clusters 2, especially their cluster nuclei 5 preferably composed of gold. In particular, due to the great thiophilic properties of gold, a substitution is performed in the cluster shell 6, especially of triphenylphosphine, in order to fabricate the thiol bonds with the cluster nuclei 5 made from gold.

If necessary, the chemical bonding explained above for the clusters 2 or cluster nuclei 5 to the first connecting electrodes 3 can also be realized in the first embodiment and/or alternatively or additionally with reference to the second connecting electrodes 4.

In the second embodiment, the second connecting electrodes 4 are preferably fabricated in a way corresponding to that of the first connecting electrodes 3, that is, in particular, on the end sides 17 of a layer structure S. However, the second connecting electrodes 4 can also be fabricated using any other suitable means and methods, in particular, using means and methods that are different than those for the first connecting electrodes 3.

The contact of the second connecting electrodes 4 to the clusters 2 or the first connecting electrodes 3 via the in-between cluster 2 is realized preferably according to the first embodiment, that is, in particular, by placing the second connecting electrodes 4 transverse to the first connecting electrodes 3, so that a first and a second connecting electrode 3, 4 can be brought into electrical contact with each other directly at their corresponding intersecting point especially by means of only a single cluster 2—with the exception of the negligible defect locations.

In the embodiment according to FIG. 5, connecting sections 18 are set laterally, for example, affixed to the two layer structures S. The connecting sections are preferably composed of an electrically non-conductive material, for example, glass. The connecting sections 18 are preferably set back relative to the planes of the connecting electrodes 3 or 4. The connecting sections 18 form macroscopic, enlarged areas relative to the microscopically small connecting electrodes 3, 4, in order to be able to connect the two layer structures S to the connecting electrodes 3 or 4 via the connecting sections 18 or their surfaces, especially through adhesion, for example, with adhesive 19, as indicated in FIG. 5. It is especially preferred if the adhesive 19, for example, super-glue, exhibits a slight loss in volume during drying, so that the two connecting electrode arrangements are set in compression on each other.

However, the parts of the proposed component 1—especially the layer structures S with the connecting electrodes 3, 4 and the in-between clusters 2, can also be connected to each other using any other suitable means and methods—if necessary via the shown connecting sections 18—for example, through sealing in plastic or another suitable material.

In the assembled state, the first and second connecting electrodes 3, 4—optionally with the layer structures S—preferably project over the connecting sections 18 of the opposing connecting electrode arrangement in the longitudinal extent, in order to simplify a contact with the connecting electrodes 3, 4.

If necessary, the previously explained connection method for the parts of the component 1 can also be realized accordingly in the first embodiment.

Figure 6:
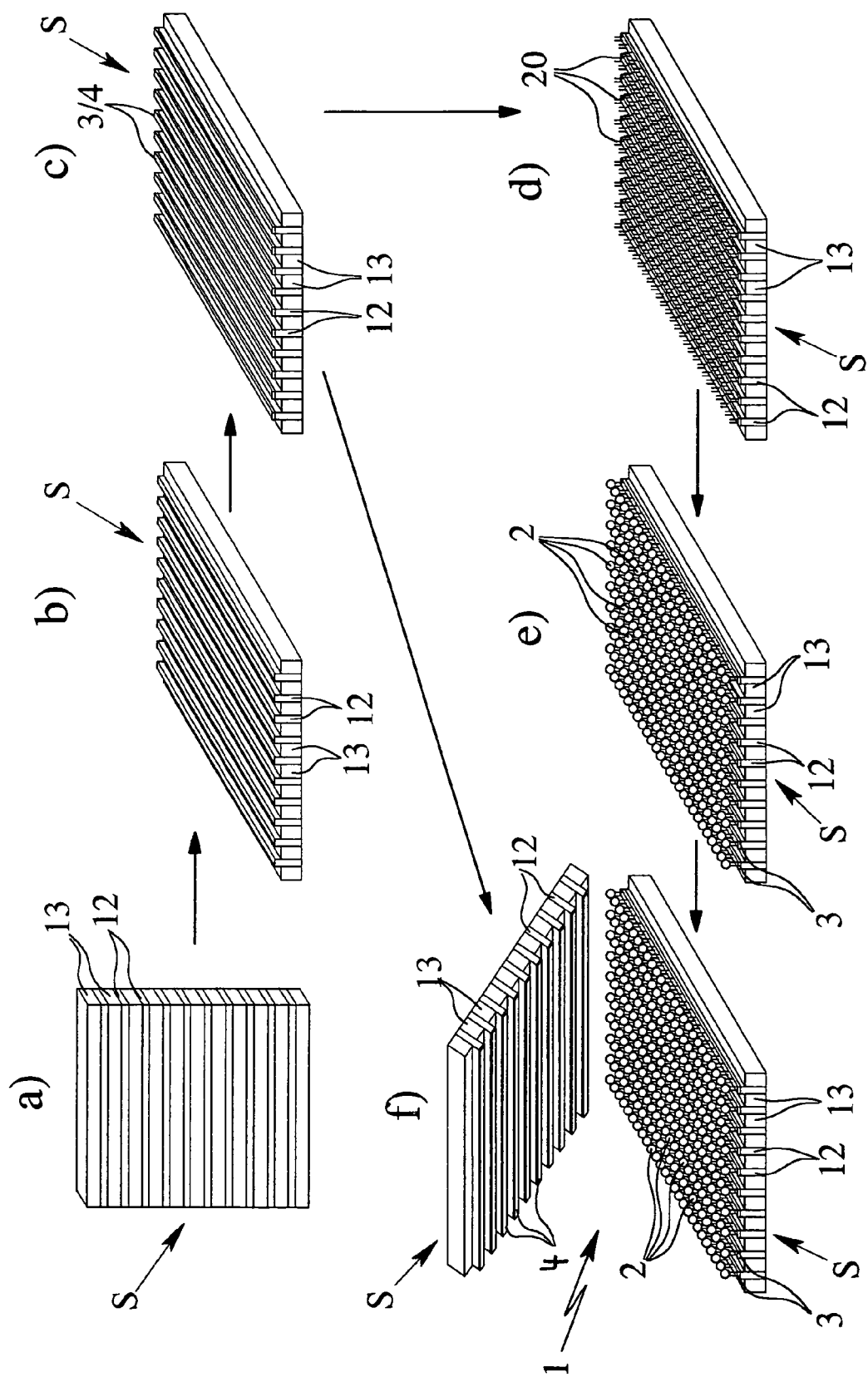
FIG. 6 is a schematic illustration of a preferred fabrication of the microelectronic component according to the second embodiment.

In a schematic illustration, FIG. 6 shows a preferred method for fabricating the microelectronic component 1 according to the second embodiment.

In the second embodiment, the layer structure S already explained with reference to the first embodiment is used directly for fabricating the connecting electrodes 3 and 4. First, in step a), the layer structure S is formed—especially as explained in the first embodiment—in particular from alternating thinner layers 12 and thicker layers 13, which are preferably composed of AlAs and GaAs. Preferably, the thickness of the thinner layers 12 is less than 5 nm, in particular, essentially only 2.5 nm.

Then, in step b), at least one side surface is machined mechanically, in particular, lapped, and then selective material is removed, preferably through etching, in order to etch the thicker layers 13 on the sides or in thickness such that the thinner layers 12 project outwards. In addition, an oxidation process is preferably performed as already explained for the first embodiment.

In step c), the preferably protruding, thinner layers 12 or their end sides 17 are provided with the connecting electrodes 3 or 4. This is realized especially through vapor deposition with a suitable material, like gold or palladium, or in another suitable way. In an especially preferred way, an oblique vapor deposition process is performed, for example, at an angle of 45° to the layer planes, so that the set-back thicker layers 13 are not coated at all or only negligibly. FIG. 6c) shows the layer structure S with the deposited first or second connecting electrodes 3 or 4.

In step d), the layer structure S with the first connecting electrodes 3 is further modified. In particular, the first connecting electrodes 3 are modified chemically, in the embodiment through phenylenedithiol, as indicated by reference symbol 20. However, other chemical substances can also be used for this purpose.

Then the first connecting electrodes 3 are occupied by the clusters 2. This is performed, in particular, through immersion into a solution with the clusters 2, preferably a dichloride methane solution. In the cluster nuclei 5 preferably composed of gold, covalent gold-sulfur bonds are formed under substitution of triphenylphosphine thanks to the great thiophilic properties of gold. In this way, the first connecting electrodes 3 preferably composed of gold can be occupied by clusters 2 very efficiently and with good preservability, as shown in FIG. 6e).

Next, the second connecting electrodes 4—which were preferably fabricated according to steps a) to c) on a second layer structure S—are brought into contact with the clusters 2 by setting the arrangement with the second connecting electrodes 4 onto the cluster rows. The first and/or second connecting electrodes 3, 4 can be pressed for electrical contact with the cluster 2 and/or stressed against this cluster and/or fixed in this position forming an electrical contact with the cluster 2, in particular, relative to each other, as already explained with reference to FIG. 5.

The two arrangements of first or second connecting electrodes 3, 4—that is, in particular, the two layer structures S—can be fixed relative to each other using any suitable means and methods. The possible side attachment of the connecting sections 18 and their possible adhesion or other connection was left out of the preceding description for reasons of simplicity. However, this can be realized by someone skilled in the art using various means and methods—according to the appropriate requirements and desired processing sequence.

Finally, preferably the first and second connecting electrodes 3 and 4 are connected electrically, which is not shown, in order for the memory cells of the proposed microelectronic component 1 to be able to respond in a desired way.

Individual aspects and features of the first and second embodiments and methods can be combined with each other arbitrarily and can also be used for other microelectronic components.

The previously mentioned methods can be performed very simply and economically. In particular, the method permits the fabrication of especially small structures that previously could not be achieved practically.

The methods according to the proposal can also be used for the fabrication of other microelectronic components, thus, if necessary, independent of the use of clusters 2 or the like. This applies especially in terms of the fabrication of the tool 10 or the layer structure S and its possible universal uses for generating very fine structures with parallel channels, edges, grooves 7, connecting electrodes 3, 4, or the like.

In the embodiments, the microelectronic component 1 has a plurality of diode-like memory cells or circuits, which can respond separately electrically and which operate or switch especially with single-electron transfers. For forming transistors, preferably additional (not-shown) control electrodes or other suitable control electrodes are provided, especially in order to form otherwise conventional memory circuits or the like.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

The invention claimed is:
1. A micro electronic component comprising:
a plurality of clusters, each cluster having a metallic cluster nucleus;
multiple first connecting electrodes; and
multiple second connecting electrodes, wherein said clusters are respectively connected to one of said first con- necting electrodes and one of said second connecting electrodes so that said clusters are respectively able to be individually accessed, independently of any other clusters, said accessing including one event from the group of events including being electrically modified and being polled, at least one of said multiple first connecting electrodes and said multiple second connecting electrodes are formed on front faces (edges) of at least one layer structure.

2. The micro electronic component of claim 1 wherein said multiple connecting electrodes are formed by vapour-deposition.

3. The micro electronic component of claim 1 wherein said at least one layer structure comprises alternate layers preferably of on one hand at least on of GaAs and $Ga_2O_3$ and on the other hand of at least one of AlAs and $Al_2O_3$.

4. A micro electronic component comprising:
a plurality of clusters, each cluster of said plurality having an average diameter of between 1.0 nm and 5.0 nm, and each cluster of said plurality having a metallic cluster nucleus, the size of each metallic cluster not exceeding approximately 2.5 nm;
multiple first connecting electrodes; and
multiple second connecting electrodes;
wherein said cluster are respectively connected to one of said first connecting electrodes and one of said second connecting electrodes so that said clusters are respectively able to be individually accessed, independently of any other clusters, said accessing including one event from the group of events including being electrically modified and being polled.

5. A micro electronic component comprising:
a plurality of clusters, each cluster having a metallic cluster nucleus;
multiple first connecting electrodes; and
multiple second connecting electrodes, wherein said clusters are respectively connected to one of said first connecting electrodes and one of said second connecting electrodes so that said clusters are respectively able to be individually accessed, independently of any other clusters, said accessing including one event from the group of events including being electrically modified and being polled, said clusters have an average diameter of 1-5 nm.

6. The micro electronic component of claim 5 wherein said micro electronic component is an electronic memory.

7. The micro electronic component according to claim 5 wherein said clusters each have an electrically insulating cluster shell.

8. The micro electronic component of claim 5 wherein most, but not all, of said clusters are respectively connected to one of said first connecting electrodes and one of the said second connecting electrodes.

9. The micro electronic component of claim 5 wherein said plurality of clusters are arranged in at least one of rows and one common plane.

10. The micro electronic component of claim 5 wherein said multiple second connecting electrodes are parallel to each other in a common plane spaced to said multiple first connecting electrodes.

11. The micro electronic component of claim 5 wherein at least one of said multiple first connecting electrodes and said multiple second connecting electrodes are at least one of pressed against said plurality of clusters, biased against said plurality of clusters, and fixed in a position contacting said plurality of clusters for electrically connecting said plurality of clusters.

12. The micro electronic component of claim 5 wherein said clusters connected to at least one said multiple first connecting electrodes and one of said multiple second connecting electrodes respectively form a tunneling contact with at least one of said multiple first connecting electrodes and one of said multiple second connecting electrodes.

13. The micro electronic component of claim 5 wherein each pair of first and second connecting electrodes is in electrical contact with each other by means of at most one cluster of said plurality of clusters.

14. The micro electronic component of claim 5 wherein at least one of said multiple first connecting electrodes and said multiple second connecting electrodes comprise a width of essentially 50 to 125% of said average diameter of said plurality of clusters.

15. The micro electronic component of claim 5 wherein at least one of said plurality of clusters or said cluster nuclei are bonded chemically to at least one of said multiple first connecting electrodes and said multiple second connecting electrodes.

16. A micro electronic component comprising:
a plurality of clusters, each cluster having a metallic cluster nucleus;
multiple first connecting electrodes; and
multiple second connecting electrodes, wherein said clusters are respectively connected to one of said connecting electrodes and one of said second connecting electrodes so that said clusters are respectively able to be individually accessed, independently of any other clusters, said accessing including one event from the group of events including being electrically modified and being polled, said metallic cluster nucleus equals at most approximately 2.5 nm.

17. The micro electronic component of claim 16 wherein at least one of said multiple first connecting electrodes and said multiple second connecting electrodes are at least one of pressed against said plurality of clusters, biased against said plurality of clusters, and fixed in a position contacting said plurality of clusters for electrically connecting said plurality of clusters.

18. The micro electronic component of claim 16 wherein said clusters connected to at least one of said multiple first connecting electrodes and one of said multiple second connecting electrodes respectively form a tunneling contact with at least one of said multiple first connecting electrodes and one of said multiple second connecting electrodes.

19. The micro electronic component of claim 16 wherein each pair of first and second connecting electrodes is in electrical contact with each other by means of at most one cluster of said plurality of clusters.

20. The micro electronic component of claim 16 wherein at least one of said multiple first connecting electrodes and said multiple second connecting electrodes comprise a width of essentially 50 to 125% of the mean diameter of said plurality of clusters.

21. The micro electronic component of claim 16 wherein at least one of said plurality of clusters or said cluster nuclei are bonded chemically to at least one of said multiple first connecting electrodes and said multiple second connecting electrodes.

22. A micro electronic component comprising:
a plurality of clusters, each cluster having a metallic cluster nucleus;
multiple first connecting electrodes; and
multiple second connecting electrodes, wherein said clusters are respectively connected to one of said first connecting electrodes and one of said second connecting electrodes so that said clusters are respectively able to be individually accessed, independently of any other clusters, said accessing including one event from the group of events including being electrically modified and being polled, said cluster nuclei contain gold and are bonded by means of thiole-bindings to at least one of said multiple first connecting electrodes and said multiple second connecting electrode.

23. The micro electronic component of claim 22 wherein said micro electronic component is an electronic memory.

24. The micro electronic component according to claim 22 wherein said clusters each have an electrically insulating cluster shell.

25. The micro electronic component of claim 22 wherein most, but not all, of said clusters are respectively connected to one of said first connecting electrodes and one of the said second connecting electrodes.

26. The micro electronic component of claim 22 wherein said plurality of clusters are arranged in at least one of rows and one common plane.

27. The micro electronic component of claim 22 wherein said multiple second connecting electrodes are parallel to each other in a common plane spaced to said multiple first connecting electrodes.

* * * * *

UNITED STATES PATENT AND TRADEMARK OFFICE
CERTIFICATE OF CORRECTION

PATENT NO.         : 7,602,069 B2
APPLICATION NO.    : 11/492473
DATED              : October 13, 2009
INVENTOR(S)        : Schmid et al.

It is certified that error appears in the above-identified patent and that said Letters Patent is hereby corrected as shown below:

On the title page, Item (54) Title, please delete "WITH ELECTRICALLY ACCESSIBLE METALLIC CLUSTERS" so that the title reads "MICRO ELECTRONIC COMPONENT".

In Claim 3, column 11, line 15, please change "at least on of" to --at least one of--.

In Claim 4, column 11, line 21, please add --nucleus-- between the words "metallic cluster" and "not exceeding" so that line 21 reads: "nucleus, the size of each metallic cluster nucleus not exceeding".

In Claim 4, column 11, line 25, please change "cluster" to --clusters--.

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

PATENT NO.          : 7,602,069 B2
APPLICATION NO.  : 11/492473
DATED                   : October 13, 2009
INVENTOR(S)         : Schmid et al.

It is certified that error appears in the above-identified patent and that said Letters Patent is hereby corrected as shown below:

On the title page, Item (54) Title and Column 1, lines 1-3, please delete "WITH ELECTRICALLY ACCESSIBLE METALLIC CLUSTERS" so that the title reads "MICRO ELECTRONIC COMPONENT".

In Claim 3, column 11, line 15, please change "at least on of" to --at least one of--.

In Claim 4, column 11, line 21, please add --nucleus-- between the words "metallic cluster" and "not exceeding" so that line 21 reads: "nucleus, the size of each metallic cluster nucleus not exceeding".

In Claim 4, column 11, line 25, please change "cluster" to --clusters--.

This certificate supersedes the Certificate of Correction issued November 24, 2009.

Signed and Sealed this

Fifteenth Day of December, 2009

David J. Kappos
*Director of the United States Patent and Trademark Office*